US010193206B2

(12) United States Patent
Ligander et al.

(10) Patent No.: US 10,193,206 B2
(45) Date of Patent: Jan. 29, 2019

(54) METHOD OF MANUFACTURING A SIGNAL TRANSITION COMPONENT HAVING A C-SHAPED CONDUCTING FRAME

(71) Applicant: Telefonaktiebolaget LM Ericsson (publ), Stockholm (SE)

(72) Inventors: Per Ligander, Göteborg (SE); Tomas Bergsten, Rångedala (SE); Ingolf Larsson, Mölndal (SE); Olle Nyström, Göteborg (SE); Torbjörn Westin, Partille (SE)

(73) Assignee: TELEFONAKTIEBOLAGET LM ERICSSON (PUBL), Stockholm (SE)

(*) Notice: Subject to any disclaimer, the term of this patent is extended or adjusted under 35 U.S.C. 154(b) by 11 days.

(21) Appl. No.: 15/500,160

(22) PCT Filed: Sep. 2, 2014

(86) PCT No.: PCT/EP2014/068639
§ 371 (c)(1),
(2) Date: Jan. 30, 2017

(87) PCT Pub. No.: WO2016/034212
PCT Pub. Date: Mar. 10, 2016

(65) Prior Publication Data
US 2017/0273172 A1   Sep. 21, 2017

(51) Int. Cl.
| H01P 11/00 | (2006.01) |
| H01P 1/04 | (2006.01) |
| H05K 1/18 | (2006.01) |
| H05K 1/11 | (2006.01) |
| H05K 3/42 | (2006.01) |
| H05K 1/02 | (2006.01) |

(Continued)

(52) U.S. Cl.
CPC .......... *H01P 11/003* (2013.01); *H01P 1/045* (2013.01); *H01P 1/047* (2013.01); *H01P 11/005* (2013.01);

(Continued)

(58) Field of Classification Search
CPC .. H01P 5/085; H01P 5/08; H01P 1/045; H01P 1/047; H01P 3/04; H01P 3/088; H01P 11/003; H01P 11/005

(Continued)

(56) References Cited

U.S. PATENT DOCUMENTS

| 3,303,439 | A | * | 2/1967 | Fulp | .................. H01P 3/085 |
| | | | | | 333/246 |
| 4,837,529 | A | * | 6/1989 | Gawronski et al. | .... H01P 5/085 |
| | | | | | 333/260 |

(Continued)

FOREIGN PATENT DOCUMENTS

| WO | 2012099597 A1 | 7/2012 |
| WO | 2013192264 A1 | 12/2013 |

*Primary Examiner* — Benny Lee
(74) *Attorney, Agent, or Firm* — Coats & Bennett, PLLC

(57) ABSTRACT

The present invention relates to a microwave signal transition component (1) having a first signal conductor side (2) and a second signal conductor side (3). The signal transition component (1) is arranged for transfer of microwave signals from the first signal conductor side (2) to the second signal conductor side (3). The transfer component (1) comprises at least one, at least partly circumferentially running, electrically conducting frame (4), a dielectric filling (5) positioned at least partly within said conducting frame (4), at least one filling aperture (6; 6a, 6b) miming through the dielectric filling, and, for each filling aperture (6; 6a, 6b), an electrically conducting connection (7; 7a, 7b) that at least partly is positioned within said filling aperture (6; 6a, 6b). The present invention also relates to a method for manufacturing a microwave signal transition component according to the above.

4 Claims, 7 Drawing Sheets

(51) Int. Cl.
  *H05K 3/40* (2006.01)
  *H01P 5/08* (2006.01)

(52) U.S. Cl.
  CPC ......... *H05K 1/0242* (2013.01); *H05K 1/0251* (2013.01); *H05K 1/115* (2013.01); *H05K 1/184* (2013.01); *H05K 3/42* (2013.01); *H01P 5/085* (2013.01); *H05K 1/0243* (2013.01); *H05K 3/4038* (2013.01); *H05K 2201/0784* (2013.01); *H05K 2201/10583* (2013.01)

(58) Field of Classification Search
  USPC .................................................. 333/33, 246
  See application file for complete search history.

(56) References Cited

U.S. PATENT DOCUMENTS

| | | | | |
|---|---|---|---|---|
| 5,508,666 A | * | 4/1996 | Nguyen | H01P 5/085 333/246 |
| 6,362,703 B1 | * | 3/2002 | Keesey et al. | H01P 1/047 333/243 |
| 6,400,241 B1 | * | 6/2002 | Ulian et al. | H01P 1/047 333/246 |
| 6,590,478 B2 | * | 7/2003 | Pluymers | H01P 1/047 333/246 |
| 2002/0070826 A1 | * | 6/2002 | Aruga | H01P 1/047 333/246 |
| 2004/0217830 A1 | * | 11/2004 | Hansen et al. | H01P 1/047 333/246 |
| 2006/0033671 A1 | * | 2/2006 | Chan et al. | H01Q 13/106 343/769 |
| 2006/0118329 A1 | * | 6/2006 | Nakamura | H05K 1/0222 174/260 |
| 2007/0124930 A1 | | 6/2007 | Cheng et al. | |
| 2010/0019859 A1 | * | 1/2010 | Lascari | H01P 1/047 333/33 |
| 2011/0019376 A1 | | 1/2011 | Hardin et al. | |
| 2014/0126168 A1 | | 5/2014 | Fujita et al. | |

\* cited by examiner

METHOD OF MANUFACTURING A SIGNAL TRANSITION COMPONENT HAVING A C-SHAPED CONDUCTING FRAME

TECHNICAL FIELD

The present invention relates to a microwave signal transition component having a first signal conductor side and a second signal conductor side. The signal transition component is arranged for transfer of microwave signals from the first signal conductor side to the second signal conductor side.

The present invention also relates to a method for manufacturing a signal transition component.

BACKGROUND

To make microwave signal transitions in printed circuit boards (PCB's) and the like, metal plated via holes are normally used. To make a well-defined impedance matching of such via holes is difficult, since the impedance is dependent on the via hole size and length. To reduce microwave radiation within the PCB, it is also necessary to put grounded via holes around a via carrying a microwave signal. This type of solution takes up to much area on the PCB, and is time-consuming as well as expensive to manufacture.

Present solutions thus take up too much area, are dependent on manufacturing tolerances, have a lack of robustness, have high losses and are difficult to match to specific impedance.

It is therefore desired to obtain a microwave signal transition that is more compact, easier to manufacture in a robust and reliable manner, and which is less difficult to match to a specific impedance.

SUMMARY OF THE INVENTION

It is an object of the present invention to provide a microwave signal transition that is more compact, easier to manufacture in a robust and reliable manner, and which is less difficult to match to a specific impedance than prior microwave signal transitions.

The object is obtained by means of a microwave signal transition component having a first signal conductor side and a second signal conductor side. The signal transition component is arranged for transfer of microwave signals from the first signal conductor side to the second signal conductor side. The transfer component comprises at least one, at least partly circumferentially extending, electrically conducting frame, a dielectric filling positioned at least partly within the conducting frame, at least one filling aperture extending through the dielectric filling, and, for each filling aperture, an electrically conducting connection that at least partly is positioned within the filling aperture.

According to an example, the electrically conducting connection is in the form of an electrically conducting plating that at least partly covers the inner surface of said filling aperture.

According to another example, the transition component is arranged to be positioned in a corresponding circuit board aperture.

According to another example, each electrically conducting plating is arranged to be connected to at least one electric conductor. Each electric conductor extends in at least a corresponding signal conductor plane on a circuit board in which the transition component is arranged to be positioned.

According to another example, there is one filling aperture with a corresponding electrically conducting plating in the dielectric filling, providing a coaxial transition.

For such a coaxial transition, the electrically conducting plating may for example be arranged to be electrically connected to a radiating aperture arranged at a certain distance from the plating.

According to another example, the transition component comprises two filling apertures with corresponding electrically conducting platings in the dielectric filling, providing a balanced transition.

The present invention also relates to a method for manufacturing a signal transition component where the method comprises the steps:

Providing an electrically conducting plate, having a certain thickness between a first signal conductor side and a second signal conductor side.

Machining a plate aperture in the electrically conducting plate.

Filling the plate aperture with a dielectric material.

Machining at least one filling aperture in the dielectric material.

Plating each filling aperture with an electrically conducting plating that at least partly covers the inner surface of said filling aperture.

Other examples are disclosed in the dependent claims.

A number of advantages are obtained by means of the present invention. For example:

Small size and small area for both coaxial and balanced transition

Low manufacturing costs

Low losses

Accurate matching to specific impedance

Millimeter wave capable, DC-300 GHz

Mechanically robust

Undesired radiation reduced

BRIEF DESCRIPTION OF THE DRAWINGS

The present invention will now be described more in detail with reference to the appended drawings, where.

DETAILED DESCRIPTION OF THE INVENTION

Figure 1:
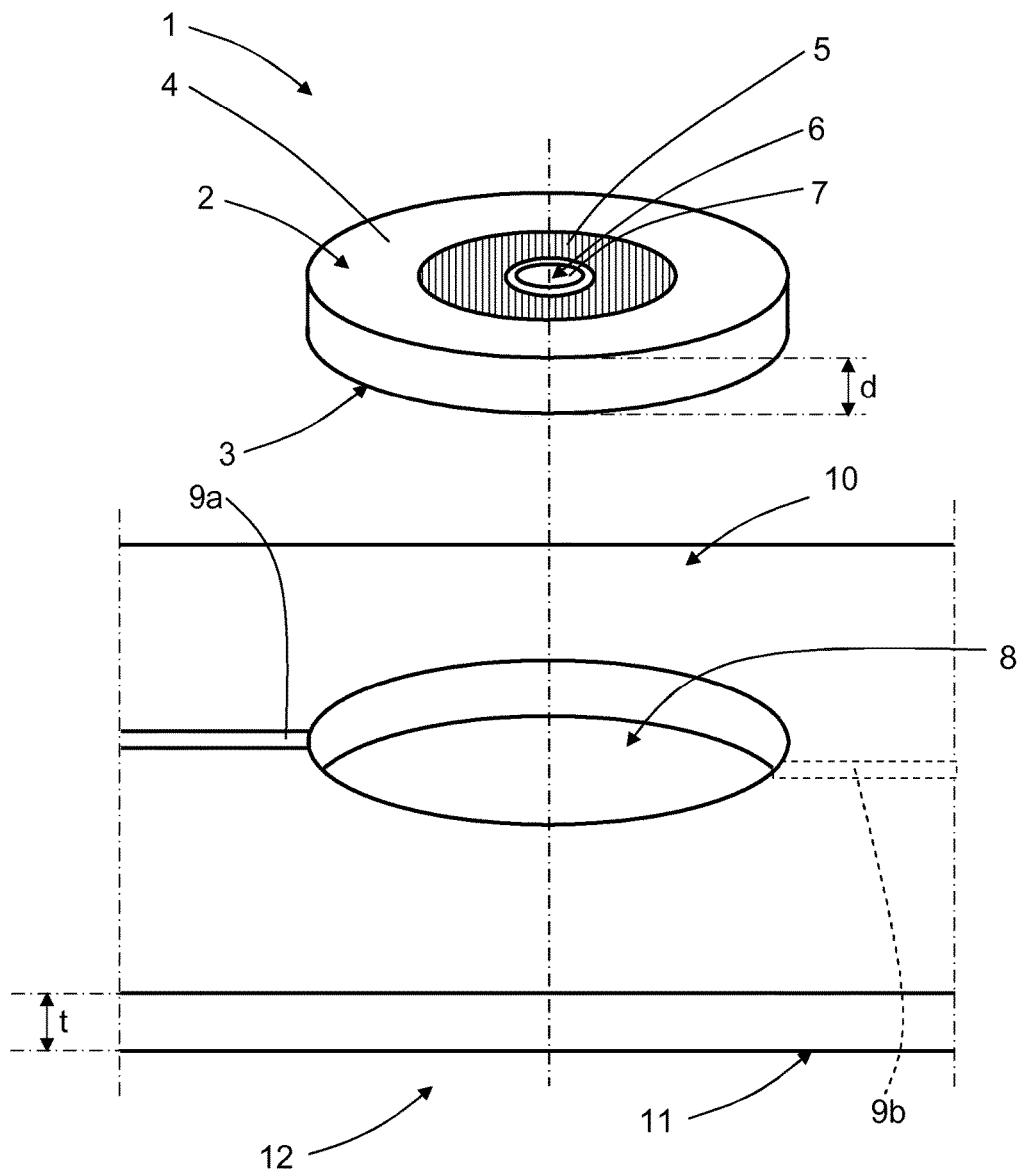
FIG. 1 schematically shows a perspective view of a microwave signal transition component and a PCB.

With reference to FIG. 1, there is a printed circuit board (PCB) 12 having a first signal conductor plane 10 and a second signal conductor plane 11. In the first signal conductor plane 10, a first microwave signal conductor 9a extends towards a circuit board aperture 8, and in the second signal conductor plane 11, a second microwave signal conductor 9b extends towards the circuit board aperture 8. The microwave signal conductors 9a, 9b have a certain width and are etched out of a copper layer on each corresponding signal conductor plane 10, 11 in a previously known manner.

According to the present invention, there is a microwave signal transition component 1 having a first signal conductor side 2 and a second signal conductor side 3. The transition component 1 is arranged for transfer of microwave signals from the first signal conductor side 2 to the second signal conductor side 3. The transfer component 1 comprises at least one, a circumferentially extending electrically conducting frame 4, a dielectric filling 5 positioned within the conducting frame 4 and one filling aperture 6 extending through the dielectric filling.

In the filling aperture 6 there is an electrically conducting plating 7 that covers the inner surface of the filling aperture 6. The electrically conducting plating 7 covers a part of the dielectric filling 5 on the first signal conductor side 2 and the second signal conductor side 3, such that a circular conductor part is formed on each side of the dielectric filling 5.

The first signal conductor side 2 and the second signal conductor side 3 are separated by a first distance d, constituting a thickness of the transition component 1. Correspondingly, the first signal conductor plane 10 and the second signal conductor plane 11 are separated by a second distance t, constituting a thickness of the PCB 12. The first distance d and the second distance t are roughly of the same magnitude, and may be essentially equal. The transfer component 1 is arranged to be positioned in the circuit board aperture 8 and the plating is arranged to be connected to the conductors 9a, 9b.

Figure 2:
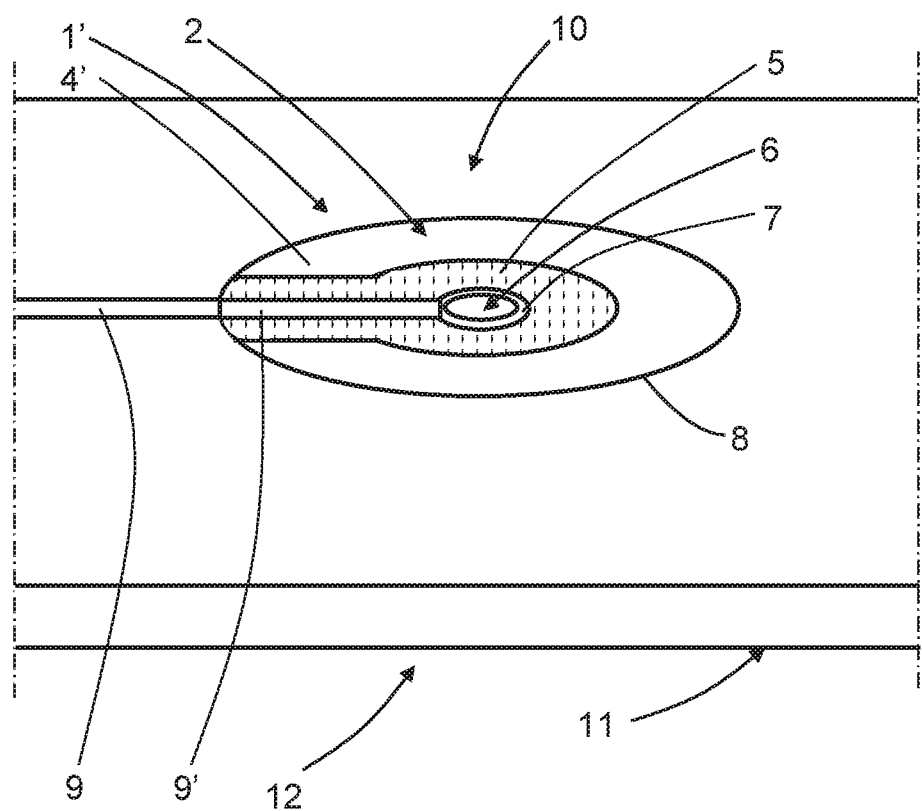
FIG. 2 schematically shows a perspective view of a mounted alternative microwave signal transition component.

Due to the presence of the electrically conducting frame 4, in order to obtain a practical connection, there has to be an opening in the electrically conducting frame 4 that allows a conductor to reach the plating without causing a short-circuit. An example of this is illustrated in FIG. 2, showing an alternative transition component 1' mounted in a circuit board aperture 8. Here, the transition component 1' comprises a conducting frame 4' that has a C-shape, i.e., it has an opening that is filled with the dielectric filling 5 and which extends to the PCB 12. A microwave signal conductor 9, only one of which is shown in this example for reasons of clarity, extends on the first signal conductor plane 10 and is connected to a partial microwave signal conductor 9' which extends on the dielectric filling 5, connecting the microwave signal conductor 9 to the plating 7. The alternative transition component 1' has a first signal conductor side 2, and a filling aperture 6.

Although not shown, a similar arrangement may be apparent on the second signal conductor plane 11 and the second signal conductor side 3. It is even conceivable that the conducting frame has several openings, being constituted by separated parts, in order to allow microwave signal conductors to reach the plating from different directions on different sides.

Figure 3:
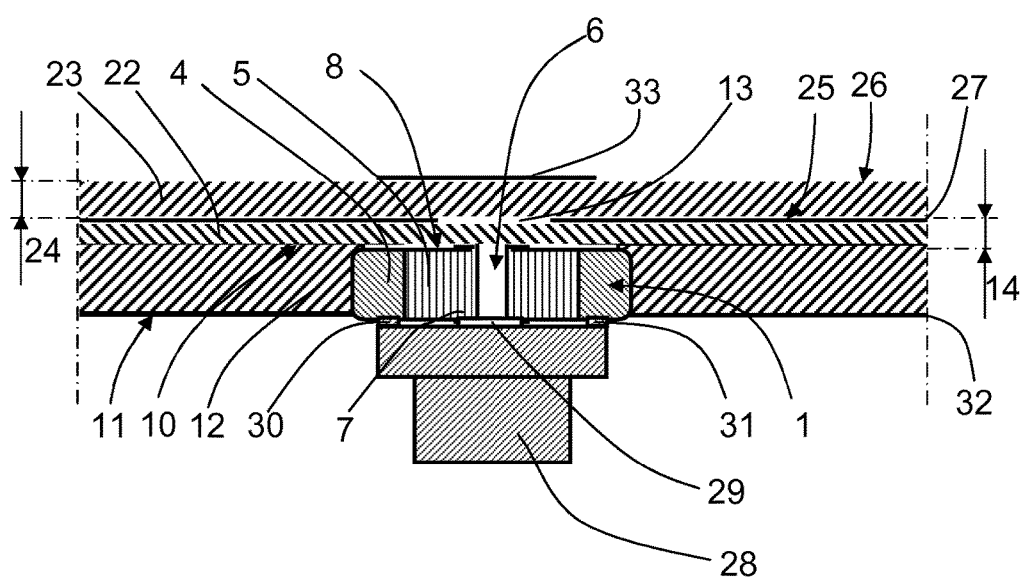
FIG. 3 schematically shows a section side view of a mounted microwave signal transition component.

With reference to FIG. 3, there is no opening in the conducting frame 4. Here, the transition component 1 is mounted in a circuit board aperture 8. The first signal conductor plane 10 has no conductors present, at least not in the vicinity of the transition component 1, and faces a spacing material 22, which could be a PCB or any other type of microwave laminate or even a foam material such as polymethacrylimide or the like. The spacing material 22 has a thickness 14 to a top layer material 23, which could be a PCB or any other type of microwave laminate. The top layer material 23 has a top thickness 24 and comprises a first top plane 25, facing the spacing material 22, and a second top plane 26, facing away from the spacing material 22. The first top plane 25 comprises a copper layer 27 which in turn comprises an aperture 13, for example in the form of a slot, positioned above the transition component 1. The second top plane 26 comprises a radiating copper layer patch 33, positioned above the aperture 13. The transition component 1 has a filling aperture 6.

The second signal conductor plane 11 faces a surface-mounted coaxial connector 28, which has an inner conductor 29 and outer ground connectors 30, 31. The inner conductor 29 is electrically connected to the plating 7 on the second signal conductor side (not indicated in FIG. 3 since it is hidden), and the outer ground connectors 30, 31 are electrically connected to the electrically conducting frame 4, which in turn is electrically connected to a ground copper layer 32 on the second signal conductor plane 11. Dielectric filing 5 is shown in FIG. 3.

This means that a microwave signal that is transferred via the inner conductor 29 and the plating 7 is received and/or transmitted via the aperture 13 and the radiating patch 33, where the aperture 13 and the radiating patch 33 constitute an aperture-fed antenna arrangement.

The above is only an example of a coaxial arrangement comprising the transition component 1; many other types are of course conceivable. For example, in the example with reference to FIG. 3, the copper cladding comprising the aperture 13 may be comprised in the spacing material 22 instead of in the top layer material 23.

With reference to FIG. 4A, FIG. 4B, FIG. 4C, FIG. 4D, FIG. 4E, and FIG. 5, a manufacturing method of the transition component 1 will be described.

Figure 4A:
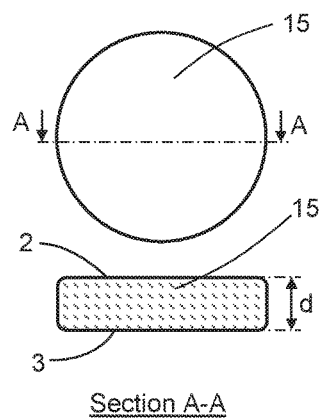
FIG. 4A schematically shows a top view and a section side view of a first step for manufacturing a microwave signal transition component.

The method comprises the steps:

Providing (step 17, FIG. 5) an electrically conducting plate 15, having a certain thickness d between a first signal conductor side 2 and a second signal conductor side 3, as shown in FIG. 4A (which includes a Section A-A view taken along line A-A of FIG. 4A). FIG. 4A shows thickness d.

Figure 4B:
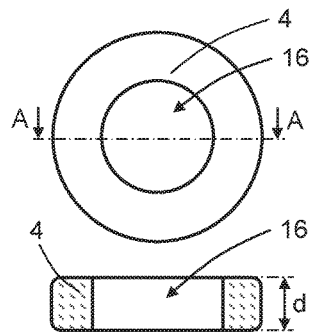
FIG. 4B schematically shows a top view and a section side view of a second step for manufacturing a microwave signal transition component.

Machining (step 18, FIG. 5) a plate aperture 16 in the electrically conducting plate 15 (FIG. 4A), to create conducting frame 4, as shown in FIG. 4B (which includes a Section A-A view taken along line A-A of FIG. 4B). FIG. 4B shows thickness d.

Figure 4C:
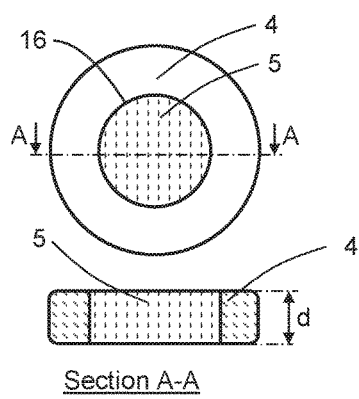
FIG. 4C schematically shows a top view and a section side view of a third step for manufacturing a microwave signal transition component.

Filling (step 19, FIG. 5) the plate aperture 16 in conducting frame 4 with a dielectric material 5, as shown in FIG. 4C (which includes a Section A-A view taken along line A-A of FIG. 4C). FIG. 4C shows thickness d.

Figure 4D:
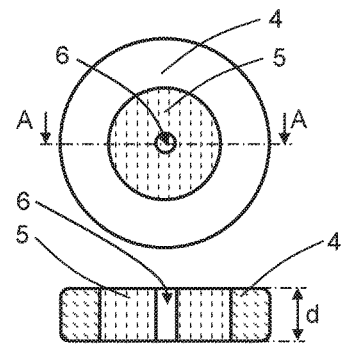
FIG. 4D schematically shows a top view and a section side view of a fourth step for manufacturing a microwave signal transition component.

Machining (step 20, FIG. 5) at least one filling aperture 6 in the dielectric material 5 associated with conducting frame 4, as shown in FIG. 4D (which includes a Section A-A view taken along line A-A of FIG. 4D). FIG. 4D shows thickness d.

Figure 4E:
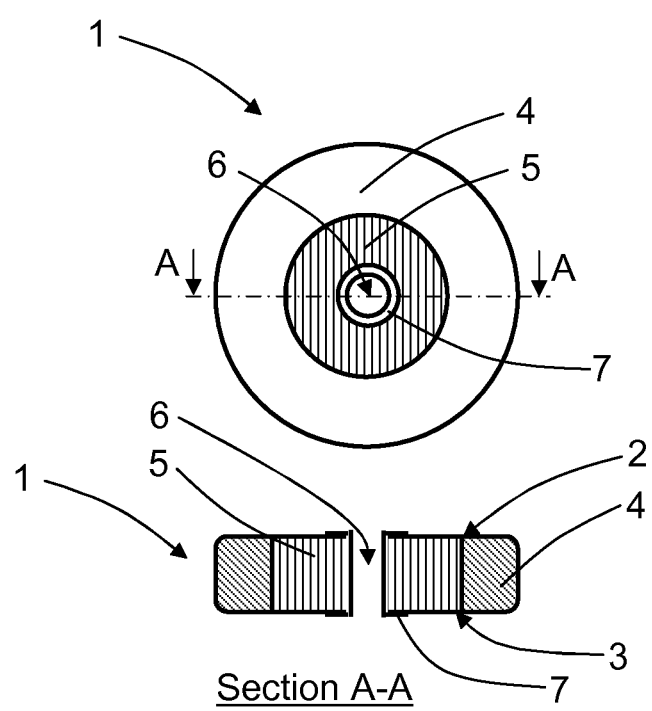
FIG. 4E schematically shows a top view and a section side view of a fifth step for manufacturing a microwave signal transition component.
Figure 5:
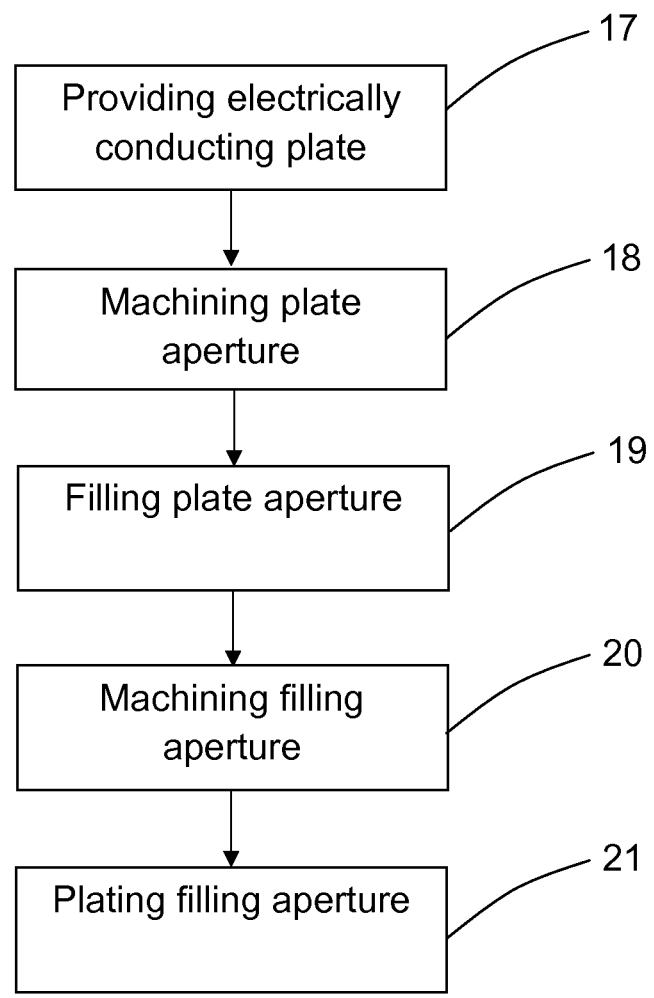
FIG. 5 shows a flow chart of a method for manufacturing a microwave signal transition component.

Plating (step 21, FIG. 5) each filling aperture 6 (in dielectric material 5 associated with conducting frame 4) with an electrically conducting plating 7 that at least partly covers the inner surface of the filling aperture 6, as shown in FIG. 4E (which includes a Section A-A view taken along line A-A of FIG. 4E). FIG. 4E shows transition component 1, first signal conductor side 2, second signal conductor side 3, and dielectric filling 5.

Figure 6:
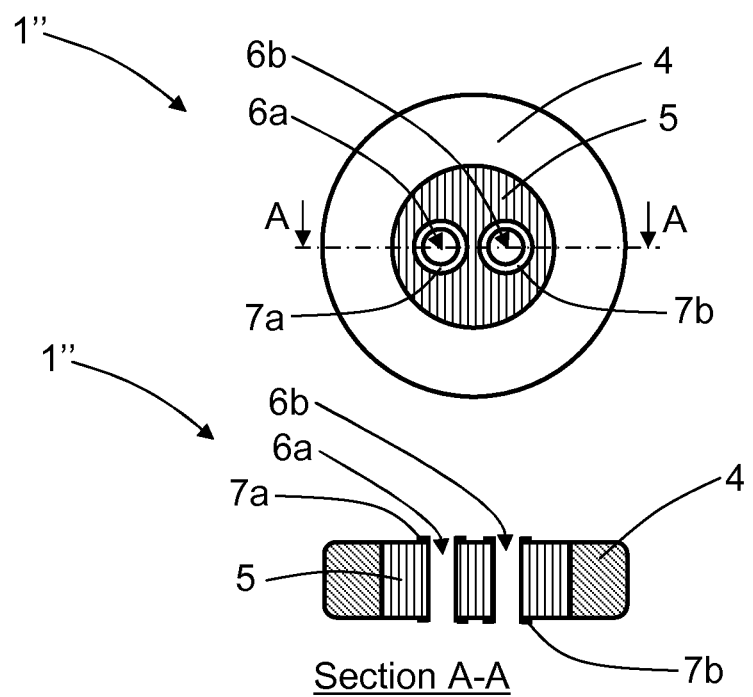
FIG. 6 schematically shows a top view and a section side view of an alternative microwave signal transition component.

FIG. 6 shows an alternative transition component 1" that comprises two filling apertures 6a, 6b with corresponding electrically conducting platings 7a, 7b in the dielectric filling 5, providing a balanced transition, in contrast to the co-axial transitions disclosed in the previous examples. The alternative transition component 1" comprises dielectric material 5 associated with conducting frame 4. Line A-A is shown in FIG. 6.

The invention is not limited to the examples described above, but may vary freely within the scope of the appended claims. For example, the dielectric filling 5 may be in the form of any suitable material such as for examples an epoxy compound or a material based on PTFE (Polytetrafluoroethylene) or ceramics. The type and characteristic of the dielectric filling 5 will influence the impedance obtained. Different types of dielectric will give different type of impedance. For example, epoxy have a dielectric constant of about 3.6, and with a plating aperture diameter of Ø 1.5 mm and a filling aperture diameter of Ø 0.3 mm, this will result in a characteristic impedance of about 50 ohm. These values are of course only part of an illustrating example, and could have any suitable value depending on chosen materials, desired characteristic impedance and number of platings.

As a further example, the thickness d of the transition component 1 may vary between 200 μm and a number of millimeters as shown in FIG. 1.

The electrically conducting materials may be in any suitable form, for example made in a solid electric material such as copper which may be plated, for example by gold or another suitable metal. It is also conceivable that some electrically conducting material pieces such as the conducting frame is made in non-conducting material such as plastics, that is coated with an electrically conducting material, for example by gold or another suitable metal.

Referring to FIG. 3, the platings may be solid, i.e., in the form of solid metal pillars, where each one more or less, fills the filling aperture 6. Generally, with reference to FIG. 1 and FIG. 6, an electrically conducting connection 7; 7a, 7b is at least partly positioned within each filling aperture 6; 6a, 6b.

Other types of connections to microwave signal conductors 9; 9a, 9b than using an opening or openings in the conducting frame as discussed with reference to FIG. 2 are conceivable. For example, bond wires or air-bridged conductors may be used to connect microwave signal conductors 9; 9a, 9b to corresponding platings.

Electrical connections may be made by means of for example soldering or gluing with electrically conducting glue.

The microwave signal conductors are generally in the form of electric conductors.

There may be any number of filling aperture 6; 6a, 6b, and electrically conducting connections 7; 7a, 7b such as platings for each transition component 1.

The transition component 1 has been shown as circular, but may have any suitable shape such as square, triangular, oval or polygonal.

Unwanted radiation is reduced, since the radiation is better confined to the dielectric materials in this type of transition.

The size and cost of this type of transition is relatively low, for example since no special via ground frames have to be made. Since the transition is made as a separate component, several types may be made to be part of a standard supply, in the PCB only a fitting aperture has to be made.

The PCB and laminates in the examples may be made in any suitable material such as materials based on PTFE or epoxy, with or without re-enforcing glass fiber. Ceramic materials are also conceivable.

The invention claimed is:

1. A method of manufacturing a signal transition component, comprising:
   providing an electrically conducting plate having a thickness between a first signal conductor side and a second signal conductor side;
   machining a plate aperture in the electrically conducting plate so as to form a first at least partly circumferentially extending electrically conducting frame;
   filling the plate aperture with a dielectric material;
   machining a first filling aperture in the dielectric material;
   plating the first filling aperture with an electrically conducting plating that at least partly covers the inner surface of the first filling aperture;
   wherein the transition component comprises a single conducting frame which is the first conducting frame;
   wherein the first conducting frame has a C-shape.

2. The method of claim 1, wherein the electrically conducting plating covers a part of the dielectric filling on the first signal conductor side and/or the second signal conductor side.

3. The method of claim 1, further comprising:
   machining a second filling aperture in the dielectric material;
   plating the second filling aperture with an electrically conducting plating that at least partly covers the inner surface of the second filling aperture.

4. The method of claim 1, wherein the electrically conducting plating solidly occupies all of the first filling aperture.

* * * * *